(12) United States Patent
Jau et al.

(10) Patent No.: US 10,061,362 B2
(45) Date of Patent: Aug. 28, 2018

(54) SERVER DEVICE

(71) Applicant: Quanta Computer Inc., Taoyuan Shien (TW)

(72) Inventors: Maw-Zan Jau, Taipei (TW); Chao-Jung Chen, New Taipei (TW); Chih-Ming Chen, Taoyuan (TW); Wei-Cheng Tseng, New Taipei (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 14/300,434

(22) Filed: Jun. 10, 2014

(65) Prior Publication Data
US 2015/0192970 A1 Jul. 9, 2015

(30) Foreign Application Priority Data
Jan. 3, 2014 (TW) .............................. 103100265 A (51) Int. Cl.
*H05K 7/14* (2006.01)
*G06F 1/18* (2006.01)
*G11B 33/12* (2006.01)

(52) U.S. Cl.
CPC ............ *G06F 1/187* (2013.01); *G11B 33/128* (2013.01); *H05K 7/1487* (2013.01)

(58) Field of Classification Search
CPC ....... G06F 1/184; G06F 1/187; G11B 33/127; G11B 33/128; G11B 33/04;
(Continued)

(56) References Cited

U.S. PATENT DOCUMENTS 5,481,431 A * 1/1996 Siahpolo ................. G06F 1/184
361/679.31
5,641,296 A * 6/1997 Larabell .................. G06F 1/184
439/157
(Continued)

FOREIGN PATENT DOCUMENTS

CN 2763871 Y 3/2006
CN 201281832 Y 7/2009
(Continued)

OTHER PUBLICATIONS

English language abstract for TW M 422142; published Feb. 1, 2012.
(Continued)

*Primary Examiner* — Hoa C Nguyen
*Assistant Examiner* — Christopher L Augustin
(74) *Attorney, Agent, or Firm* — Nixon Peabody LLP; Eduardo J. Quiñones (57) ABSTRACT

A server device includes a tray having a lug, a hard disk unit removably disposed on the tray, and a handle pivotally connected to two opposite sides of the hard disk unit. The lug is formed with a slot thereon to define two inner edges opposite to each other. The handle is provided with a protrusion arranged in the slot. When the handle is rotated towards one end of the hard disk unit, the protrusion is rotated along with the handle to contact and push one of the inner edges of the lug, such that the hard disk unit is restrained by the tray after the hard disk unit is slid in relative to the tray.

9 Claims, 11 Drawing Sheets

(58) Field of Classification Search
CPC ............ G11B 33/0405; G11B 33/0433; H05K 7/1485; H05K 7/1487; H05K 7/1488; H05K 7/1489; H05K 7/1411; H05K 7/1415; H05K 7/1401; H05K 7/1409; H05K 7/1408; H05K 7/1404; H05K 7/1405; H05K 5/0208; H05K 5/0221; H05K 5/023
USPC ........................ 361/679.31–679.39, 724–727
See application file for complete search history.

(56) References Cited

U.S. PATENT DOCUMENTS

| | | | | |
|---|---|---|---|---|
| 7,400,936 | B2* | 7/2008 | Chang | G06F 1/184 |
| | | | | 361/679.33 |
| 7,771,218 | B2* | 8/2010 | Jaramillo | H05K 7/1492 |
| | | | | 439/157 |
| 9,095,070 | B2* | 7/2015 | Ross | G11B 33/128 |
| 9,807,902 | B2* | 10/2017 | Conn | H05K 7/1489 |
| 9,823,711 | B2* | 11/2017 | Hopkins | G06F 1/187 |
| 2004/0017650 | A1* | 1/2004 | Liu | G06F 1/187 |
| | | | | 361/679.33 |
| 2006/0171110 | A1* | 8/2006 | Li | G06F 1/184 |
| | | | | 361/679.37 |
| 2007/0076366 | A1* | 4/2007 | Makabe | G06F 1/185 |
| | | | | 361/679.39 |
| 2011/0273850 | A1* | 11/2011 | Chen | H05K 5/0221 |
| | | | | 361/726 |
| 2012/0087084 | A1* | 4/2012 | Nguyen | G11B 33/124 |
| | | | | 361/679.37 |
| 2015/0043151 | A1* | 2/2015 | Cravens | G06F 1/187 |
| | | | | 361/679.37 |

FOREIGN PATENT DOCUMENTS

| | | |
|---|---|---|
| TW | M 313408 U | 6/2007 |
| TW | I 290450 B | 11/2007 |
| TW | M 422142 U | 2/2012 |
| WO | 2010147593 | 12/2010 |

OTHER PUBLICATIONS

English language abstract for TW M 313408; published Jun. 1, 2007.
English language abstract for TW I 290450; published Nov. 21, 2007.
Office Action dated Oct. 23, 2014; in a corresponding Taiwanese patent application.
Second Office Action mailed in Japanese Application No. 2014-095288 dated Nov. 17, 2015.
English language summary of Second Office Action mailed in Japanese Application No. 2014-095288 dated Nov. 17, 2015.
China Office Action for Application No. CN 2014 1 0032135.6, dated Jul. 17, 2017, w/ First Office Action Summary.

* cited by examiner

SERVER DEVICE

RELATED APPLICATIONS

This application claims priority to Taiwanese Application Serial Number 103100265, filed Jan. 3, 2014, which is herein incorporated by reference.

BACKGROUND

Field of Disclosure

The present disclosure relates to a server device. More particularly, the present disclosure relates to a server device with hard disk units.

Description of Related Art

A conventional server device is normally installed with removable hard disks for expanding or enhancing computer functions.

There are several methods for installing a hard disk in a chassis of the server device. For example, screws are used to directly secure two opposite sides of the hard disk on a support bracket of the chassis, respectively; or a slide-rail is used to directly slide the hard disk into a support bracket of the chassis and then screws are used to secure the hard disk thereon.

However, in the aforementioned methods, when the hard disk is mounted on or dismantled from the support bracket of the chassis, many screws needs to be tightened or loosened, thus resulting in complicated procedures and inconvenient operations.

SUMMARY

In view of the above, one aspect of the present disclosure is to provide a server device for overcoming the above-mentioned disadvantages existing in the prior art.

According to an embodiment, a server device includes a hard disk tray, a hard disk unit and a handle. The hard disk tray includes a placing surface and a lug. The lug is disposed on the placing surface and is formed with a slot to define two inner edges opposite to each other. The hard disk unit is removably disposed on the placing surface. The handle is pivotally connected to two opposite sides of the hard disk unit, and has a protrusion arranged in the slot.

Thus, when the handle is rotated towards one end of the hard disk unit, the protrusion is rotated along with the handle to contact and push one of the inner edges of the lug, so that the hard disk unit is restrained by the hard disk tray after the hard disk unit is slid in relative to the hard disk tray.

According to one or more embodiments, the hard disk unit includes a main body and a bracket. The bracket is fixed on the main body, and is pivotally connected by the handle.

According to one or more embodiments, the placing surface has a position-limiting hole, and the bracket has a position-limiting projection. Thus, when the handle is rotated towards the end of the hard disk unit, due to the position-limiting projection limited in the position-limiting hole, the hard disk unit is restrained by the hard disk tray.

According to one or more embodiments, the position-limiting hole has a larger area and a smaller area being communicative to the larger hole. Thus, the position-limiting projection is merely limited in the smaller area of the position-limiting hole.

According to one or more embodiments, the server device further comprises a circuit board. The circuit board is fixed on the hard disk tray, and has a first connector. The hard disk unit includes a second connector disposed on the other end of the hard disk unit. Thus, when the handle is rotated towards the end of the hard disk unit, due to the second connector pluggably connected to the first connector, the hard disk unit is restrained by the hard disk tray.

According to one or more embodiments, the handle has a first engaging portion, and the hard disk tray has a second engaging portion. Thus, when the handle is rotated towards the end of the hard disk unit, due to the first engaging portion engaged with the second engaging portion, the hard disk unit is restrained by the hard disk tray.

In the embodiment, specifically, the first engaging portion includes a movable member and an elastic member. The movable member includes a recess; the elastic member connects to the movable member and the handle. The second engaging portion includes a hook. The hook is inserted into the recess for securing the movable member. Thus, when the movable member presses the elastic member, the recess escapes from the hook.

According to one or more embodiments, the handle has a bump, and the hard disk tray has a concave. Thus, when the handle is rotated towards in a direction away from the end of the hard disk unit, the hard disk unit is released by the hard disk tray, wherein the bump is inserted into and limited in the concave.

According to one or more embodiments, two opposite outer sides of the hard disk tray have respective slide rail disposed thereon.

According to one or more embodiments, the hard disk tray has a stopper. Thus, when the handle is rotated on the end of the hard disk unit, the stopper stops the handle from rotating.

As what is disclosed above, comparing to the conventional arts, the solution provided by the present disclosure has advantages and beneficial effects. With the aforementioned solution, the technical improvement and practicability are provided and can be widely applied in the relative industries, wherein the solution provided by the present disclosure at least has the following advantages:

1. the efficiency of assembling the hard disk units is enhanced;
2. the amount of the hard disk units installed in the server device are increased; and
3. the convenience of removing or installing the hard disk units is improved.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The disclosure may be more fully understood by reading the following detailed description of the embodiment, with reference made to the accompanying drawings as follows:

FIG. 3A to FIG. 3C are side views of intermediate stages of installing a hard disk unit into a hard disk tray of the sever device according to the embodiment of the disclosure;

FIG. 5A to FIG. 5C are side views of intermediate stages of removing a hard disk unit from a hard disk tray of the sever device according to the embodiment of the disclosure.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Figure 1:
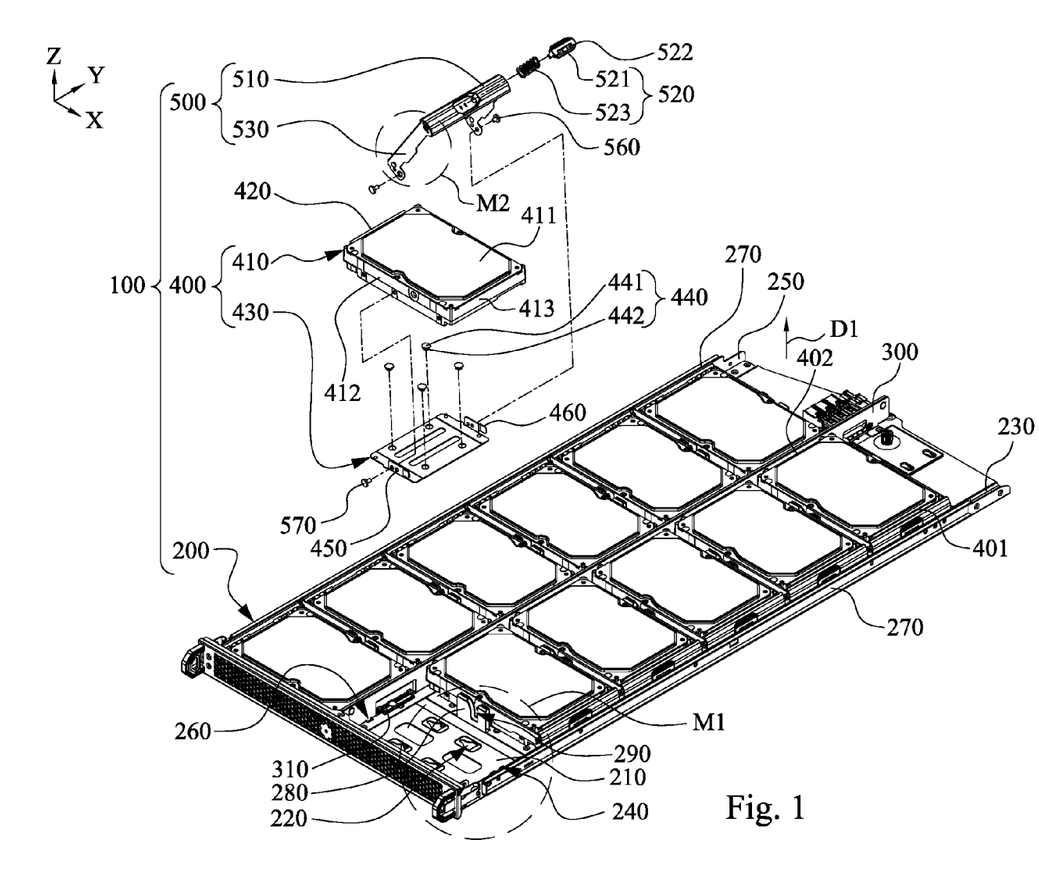
FIG. 1 is a schematic partial exploded view of a sever device according to an embodiment of the disclosure.
Figure 2A:
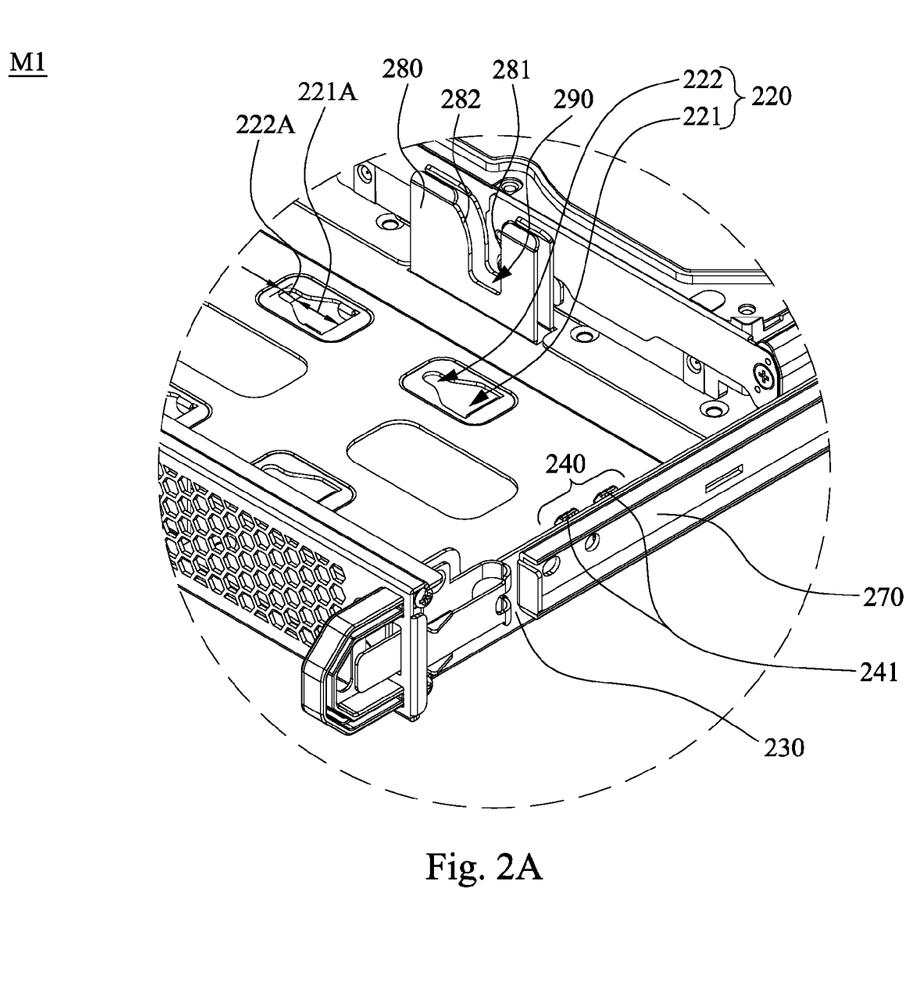
FIG. 2A is an enlarged view of an area M1 of FIG. 1.
Figure 2B:
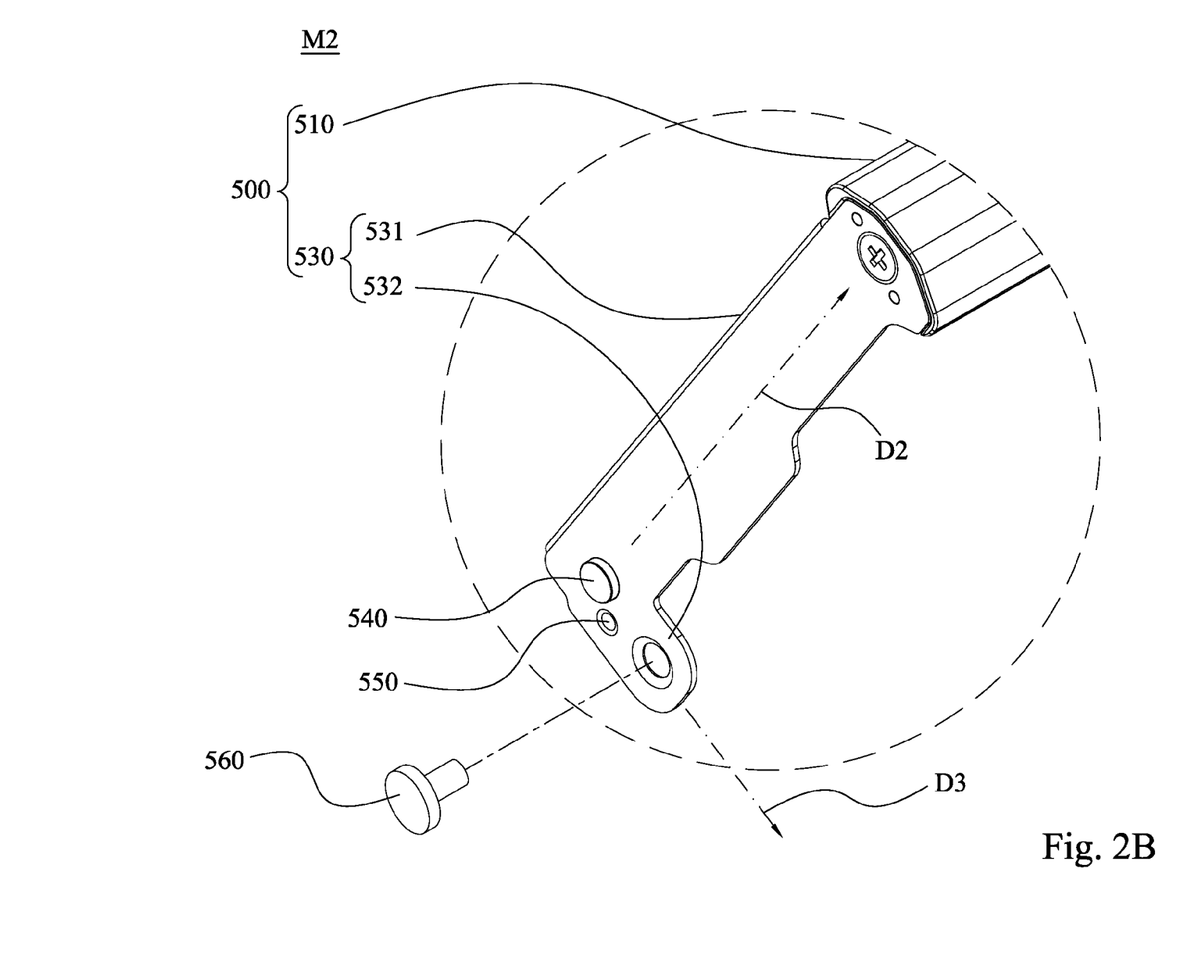
FIG. 2B is an enlarged view of an area M2 of FIG. 1.

Reference is now made to FIG. 1, FIG. 2A and FIG. 2B, in which FIG. 1 is a schematic partial exploded view of a sever device 100 according to an embodiment of the disclosure, FIG. 2A is an enlarged view of an area M1 of FIG. 1, and FIG. 2B is an enlarged view of an area M2 of FIG. 1.

According to the embodiment, the server device 100 includes a hard disk tray 200, at least one hard disk unit 400 and at least one handle 500. The hard disk tray 200 includes a placing surface 210 and two lugs 280. The lugs 280 are disposed opposite to each other on the placing surface. Each of the lugs 280 is formed with a slot 290, in which a first inner edge 281 and a second inner edge 282 opposite to each other are defined in the slot 290. The hard disk unit 400 is removably disposed on the placing surface 210 of the hard disk tray 200, and between the lugs 280. The hard disk unit 400 includes a first end 401 and a second end 402 opposite to the first end 401. The handle 500 is provided with two protrusions 540 and two pivot portions 560. The two opposite ends of the handle 500 are respectively pivotally connected to two opposite sides of the hard disk unit 400. The protrusions 540 are respectively located on the two opposite ends of the handle 500, and are respectively arranged in the corresponding slots 290.

Thus, when the handle 500 is rotated towards the first end 401 of the hard disk unit 400, the hard disk unit 400 can be moved in together to transversally slide in relative to the placing surface 210 of the hard disk tray 200, so as to be restrained by the hard disk tray 200. On the other hand, when the handle 500 is rotated towards the second end 402 of the hard disk unit 400 from the first end 401 of the hard disk unit 400, the hard disk unit 400 can be moved in together to transversally slide in relative to the placing surface 210 of the hard disk tray 200, and is released from the restraint of the hard disk tray 200 simultaneously.

In the embodiment, specifically, the hard disk tray 200 further includes a first lateral plate 230 and a second lateral plate 250. The first lateral plate 230 and the second lateral plate 250 are mutually parallel and arranged at two opposite edges of the placing surface 210 thereof, and extend together along an extending direction D1, so that the first lateral plate 230, the second lateral plate 250 and the placing surface 210 define an accommodation space 260.

The accommodation space 260 may allow plural hard disk units 400 to be received therein. The hard disk units 400 are arranged in the accommodation space 260 with a cluster style, for example, the hard disk units 400 are arranged side by side in one single layer in the accommodation space 260 with a generalized array arrangement. Therefore, the hard disk units 400 can be arbitrarily replaced from the hard disk tray 200. However, the present disclosure is not limited to the aforementioned arrangement of the hard disk units. Thus, each of the hard disk units 400 is pivotally connected with a handle 500 thereon.

Every two lugs 280 of the hard disk tray 200 are respectively arranged upright at two opposite outer sides of each of the hard disk units 400 aside, so that each of the hard disk units 400 can be restrained or released by the hard disk tray 200 while the handle 500 rotates.

The server device 100 further includes a storage array backplane 300. The storage array backplane 300 is a circuit board, and is fixed on the hard disk units 220. Moreover, the storage array backplane 300 is provided with at least one first connector 310 (e.g., hard disk connection terminals) for electrically connecting to the hard disk unit 400. In the embodiment, the storage array backplane 300 is disposed upright on the placing surface 210 of the hard disk tray 200, and is arranged between two columns of the hard disk units 400. The storage array backplane 300 has plural first connectors 310, and the first connectors 310 are respectively arranged at intervals on two opposite sides of the storage array backplane 300.

Each of the hard disk units 400 includes a main body 410 and a bracket 430. The main body 410 is substantially rectangular, including two main surfaces 411 which are opposite with each other, two lateral surfaces 412 which are opposite with each other, and two end surfaces 413 which are opposite with each other. Each of the lateral surfaces 412 is adjacently connected to the end surfaces 413, and each of the end surfaces 413 is adjacently connected to the lateral surface 412, such that the main surfaces 411 are surrounded by the end surfaces 413 and the lateral surfaces 412, and the main surfaces 411 are adjacently connected to the end surfaces 413 and the lateral surfaces 412. Because the main body 410 of the hard disk units 400 is a commonly seen hard disk product, a hard disk case is not provided, thereby defining the main body 410 of the hard disk units 400 as a naked disk driver. The first end 401 and the second end 402 are defined as the two end surfaces 413 of the main body 410 of the hard disk units 400. The second end 402 of the hard disk units 400 is provided with at least one second connector 420 (e.g., hard disk connection terminals). The second connector 420 can be a tool-free connector which can be detachably coupled to one of the first connectors 310. The bracket 430 is fixed on the main body 410. For example, a cross-sectional surface of the bracket 430 is in a U-shaped type, and the bracket 430 connects to the lower one of the main surfaces 411 of the main body 410 and the two lateral surfaces 412 adjacent to the lower main surface 411 thereof, and the bracket 430 is secured on the two opposite lateral surfaces 412 of the main body 410 through screws 570.

The handle 500 is in a U-shaped type, and the handle 500 includes two arms 530 and a holder portion 510. The arms 530 respectively locate at two opposite ends of the holder portion 510, and respectively extend towards the bracket 430 along an extending direction D2 (FIG. 2B). The two arms 530 of the handle 500 are respectively pivotally connected to the two opposite sides of the bracket 430 through the two pivot portions 560. As show in FIG. 2B, each of the arms 530 further includes a main arm body 531 and a flange 532. The main arm bodies 531 mutually extend along the extending direction D2, and the flanges 532 mutually extend along an extending direction D3 in which the extending directions D2 and D3 are orthogonal, or at least approximately orthogonal. Furthermore, each of the pivot portions 560 is on one of the flanges 532, and each of the protrusions 540 is on a junction of the main arm body 531 and the flanges 532.

Furthermore, the handle 500 is provided with a first engaging portion 520. The hard disk tray 200 is provided with a second engaging portion 240 (FIG. 2A). Thus, when one of the hard disk units 400 is restrained by the hard disk tray 200, the first engaging portion 520 is used to engage with the second engaging portion 240 to fix the second engaging portion 240. As show in FIG. 1, the first engaging portion 520 is arranged on the holder portion 510. For example, the first engaging portion 520 includes a movable member 521 and an elastic member 523. The movable member 521 includes at least one recess 522, and the elastic member 523 is disposed between the movable member 521 and the holder portion 510 of the handle 500, and the two opposite ends of the elastic member 523 respectively couple to the movable member 521 and the holder portion 510 of the handle 500. The second engaging portion 240 includes at least one hook 241. The hook 241 is formed on an inner surface of the first lateral plate 230 (FIG. 2A) for fixing the recess 522.

In addition, the hard disk tray 200 is slidably disposed in a chassis (not shown in Figure), the hard disk tray 200 is able to either eject out or return in the chassis so as to conveniently assist the hard disk unit 400. Two opposite outer sides (i.e., the first lateral plate 230 and the second lateral plate 250) of the hard disk tray 200 are respectively provided with a slide rail 270 thereon. The slide rails 270 are respectively engaged with corresponding rails (not shown in Figure) arranged in the chassis.

Figure 3A:
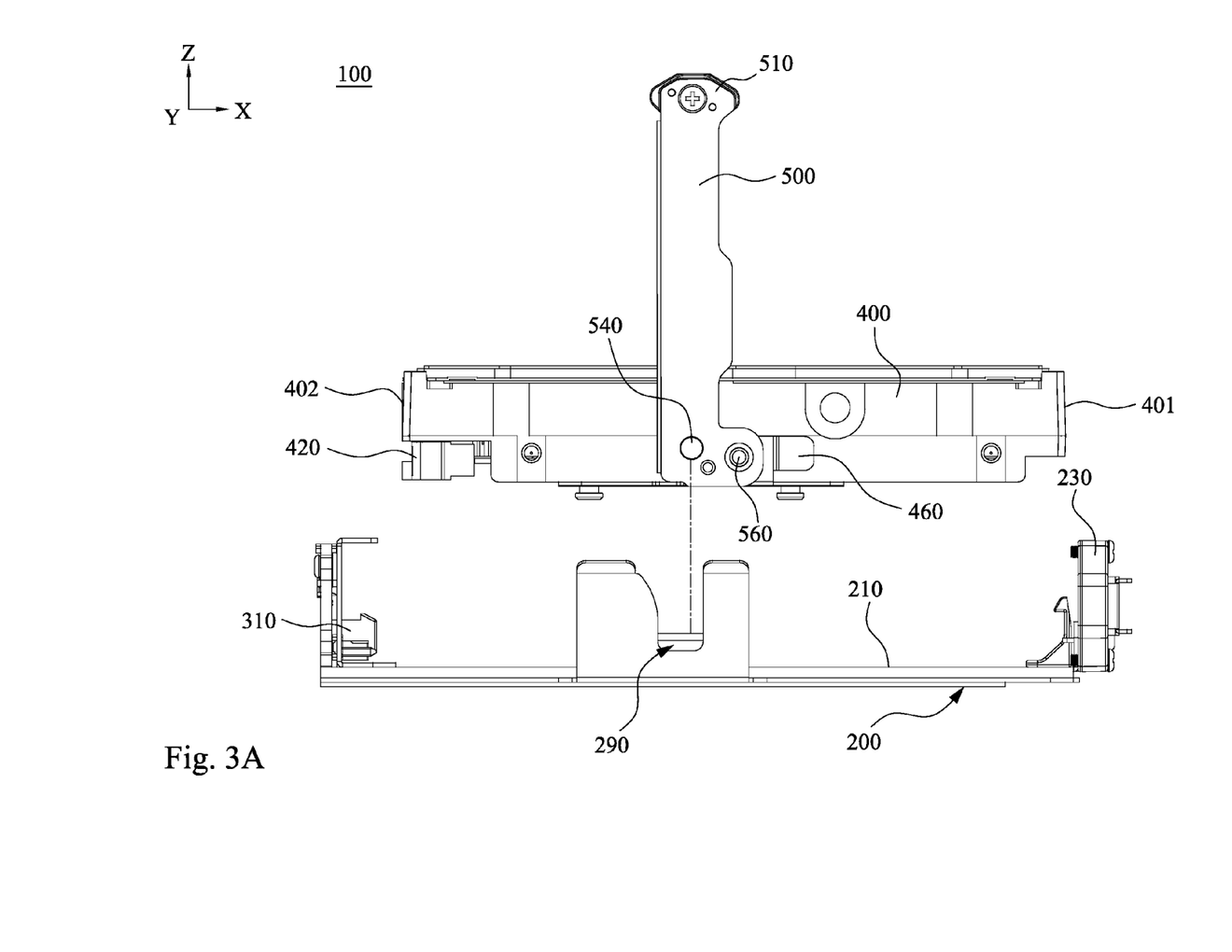
Figure 3B:
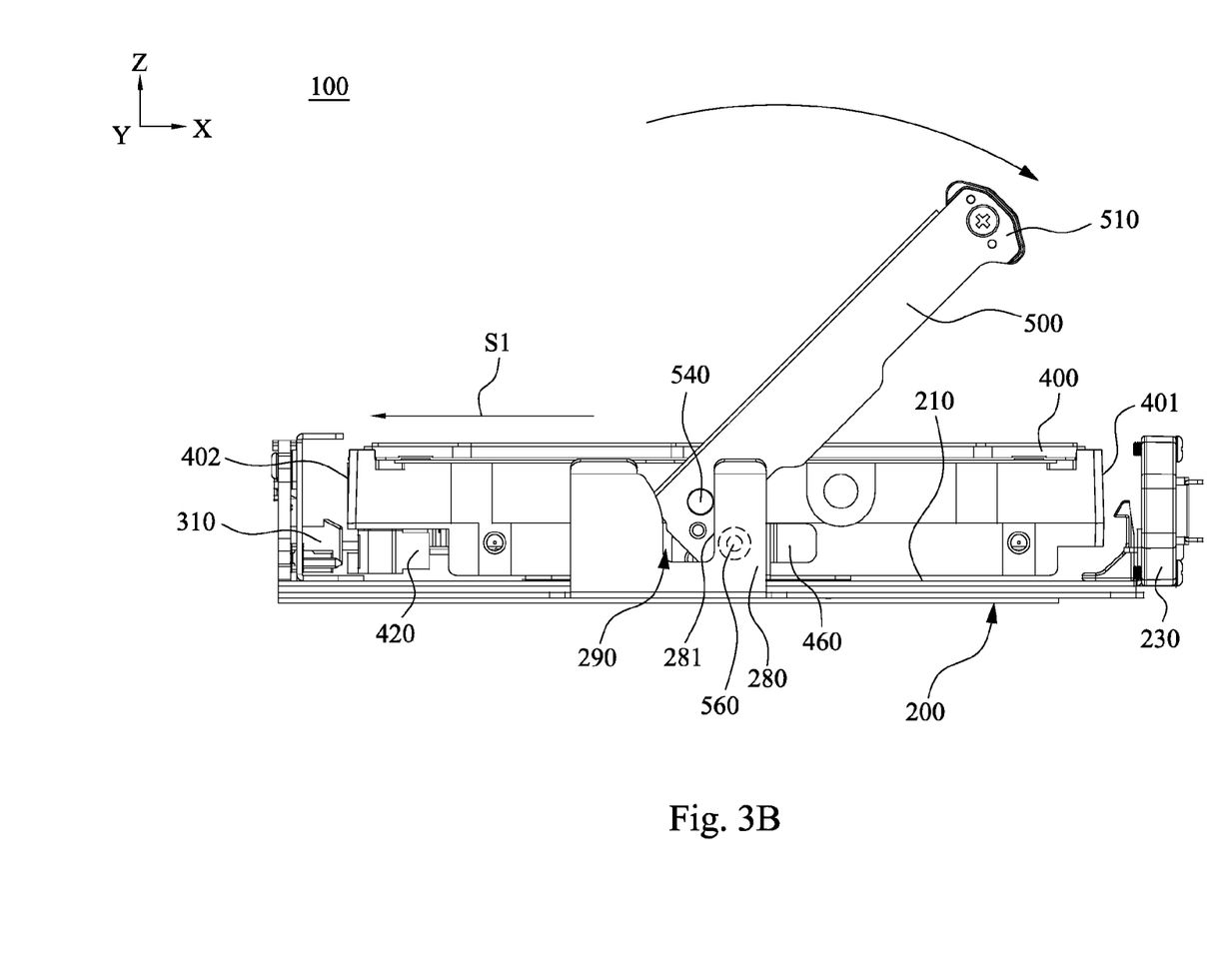
Figure 3C:
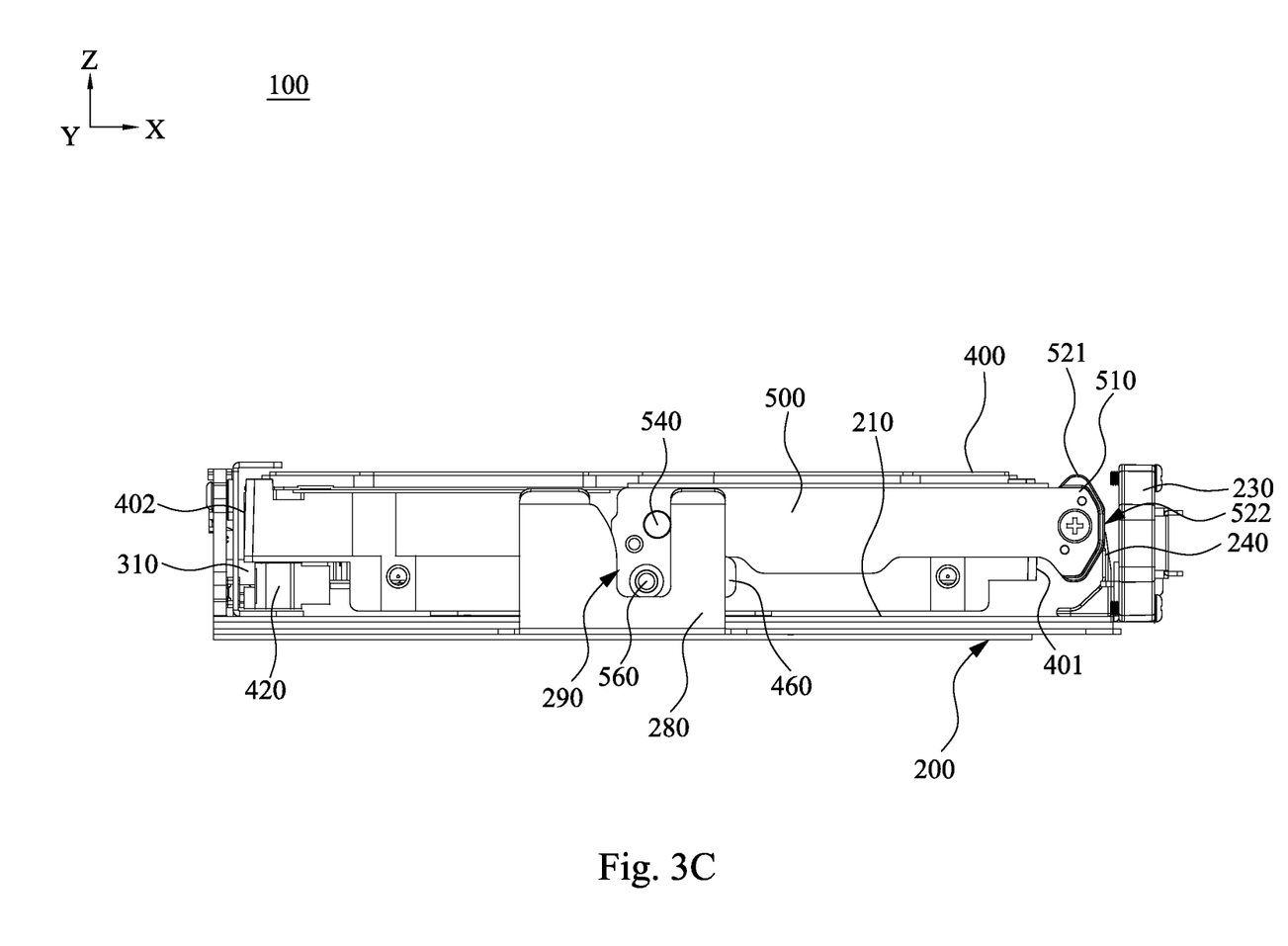

FIG. 3A to FIG. 3C are side views of intermediate stages of installing a hard disk unit 400 into a hard disk tray 200 of the sever device 100 according to the embodiment of the disclosure. The specific process illustrating a hard disk unit 400 being installed on the hard disk tray 200 by users according to the present disclosure will be explained in the embodiment below and related drawings.

As shown in FIG. 3A, when a user desires to install the hard disk unit 400 on the hard disk tray 200, the user first vertically descents the hard disk unit 400 on the placing surface 210 of the hard disk tray 200, at this moment, the slot 290 can be used as a fiducial mark by the user, so that each of the protrusions 540 of the handle 500 can be moved into the corresponding slot 290 according to the position of the slot 290.

Next, as shown in FIG. 3B, the user rotates the handle 500 towards the first end 401 of the hard disk unit 400, in the rotation of the handle 500, each of the protrusions 540 rotates around the corresponding pivot portion 560 along with the rotation of the handle 500 to further contact and then push the first inner edge 281 of the lug 280 in the slot 290. At this moment, the hard disk unit 400, on the contrary, is pushed by the lug 280 to slide in a direction S1 towards the storage array backplane 300 in relative to the placing surface 210, so as to allow the second connector 420 to detachably couple to the first connector 310 (FIG. 3C). Therefore, since the second connector 420 physically connects to the first connector 310, the hard disk unit 400 is restrained by the hard disk tray 200 to a certain degree.

At this step, as shown in FIG. 3C, the holder portion 510 of the handle 500 has already been rotated to the first end 401 of the hard disk unit 400, that is, the holder portion 510 is disposed between the first end 401 of the hard disk unit 400 and the first lateral plate 230. The hook 241 (FIG. 2) of the second engaging portion 240 is inserted into the recess 522 of the movable member 521 and restricts the movement of the movable member 521 so as to fix the handle 500. Therefore, since the handle 500 is physically fixed to the first end 401 of the hard disk unit 400, the hard disk unit 400 is restrained by the hard disk tray 200 to a certain degree.

Also, two opposite sides of the hard disk tray 430 are respectively further provided with a stopper 460. When the holder portion 510 of the handle 500 has already been rotated to the first end 401 of the hard disk unit 400, that is, the holder portion 510 is disposed between the first end 401 of the hard disk unit 400 and the first lateral plate 230, the stopper 460 stops the handle 500 from continually rotating.

It is noted, one having ordinary skill in the art of the disclosure could choose the profile of the first inner edge 281 of the lug 280 to be flat or arc by considering the move extent of the hard disk unit 400 moving towards the storage array backplane 300.

Back to FIG. 1 and FIG. 2A, in order to further effectively enhance the hard disk unit 400 being restrained by the hard disk tray 200, in the embodiment, the placing surface 210 is formed with at least one position-limiting hole 220. The position-limiting hole 220 includes a larger area 221 and a smaller area 222 connected to the larger area 221. The bracket 430 is formed with at least one position-limiting projection 440, and the position-limiting projection 440 is only limited in the smaller area 222 of the position-limiting hole 220. The position-limiting hole 220, for example, can be a keyhole, or a hole similar to the keyhole.

Substantially, the position-limiting projection 440 includes a head portion 441 and a neck portion 442 connected with each other. The diameter of the head portion 441 is greater than the diameter of the neck portion 442. The area 221A of the larger area 221 is greater than the area 222A of the smaller area 222, but the area 221A of the larger area 221 is smaller than the area of the head portion 441 of the position-limiting projection 440. When the neck portion 442 of the position-limiting projection 440 is moved into the larger area 221 from the smaller area 222 of the position-limiting hole 220, the head portion 441 of the position-limiting projection 440 is limited by the smaller area 222 of the position-limiting hole 220. That is, the head portion 441 of the position-limiting projection 440 cannot leave the position-limiting hole 220 along the axial direction of the smaller area 222 of the position-limiting hole 220. The head portion 441 of the position-limiting projection 440 only can leave the position-limiting hole 220 from the larger area 221 along the axial direction of the larger area 221 of the position-limiting hole 220.

In the embodiment, the position-limiting projection 440 is additionally assembled on the bracket 430. However, the present disclosure is not limited thereto, for example, the position-limiting projection 440 is integrally formed on the bracket 430.

Figure 4A:
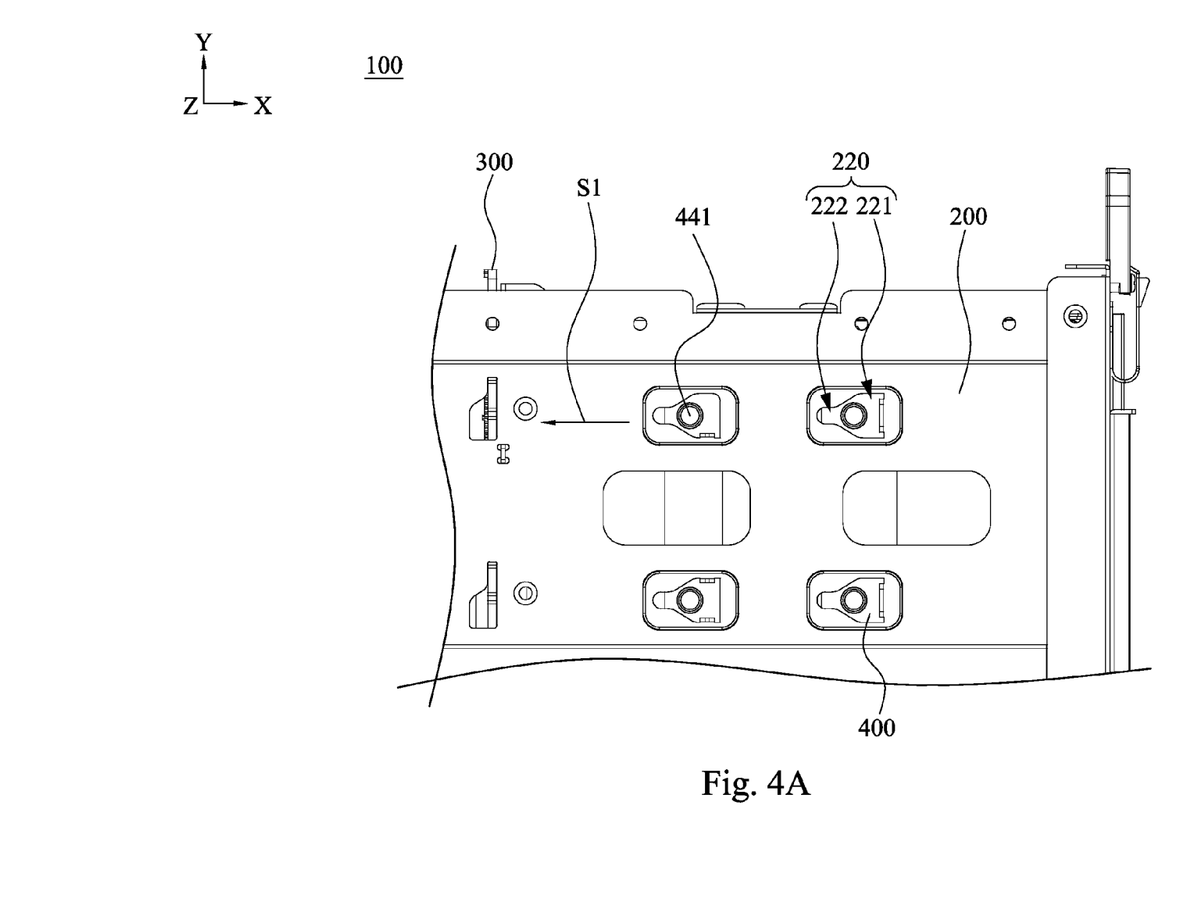
FIG. 4A to FIG. 4B are bottom views of intermediate stages of installing a hard disk unit into a hard disk tray of the sever device according to the embodiment of the disclosure.
Figure 4B:
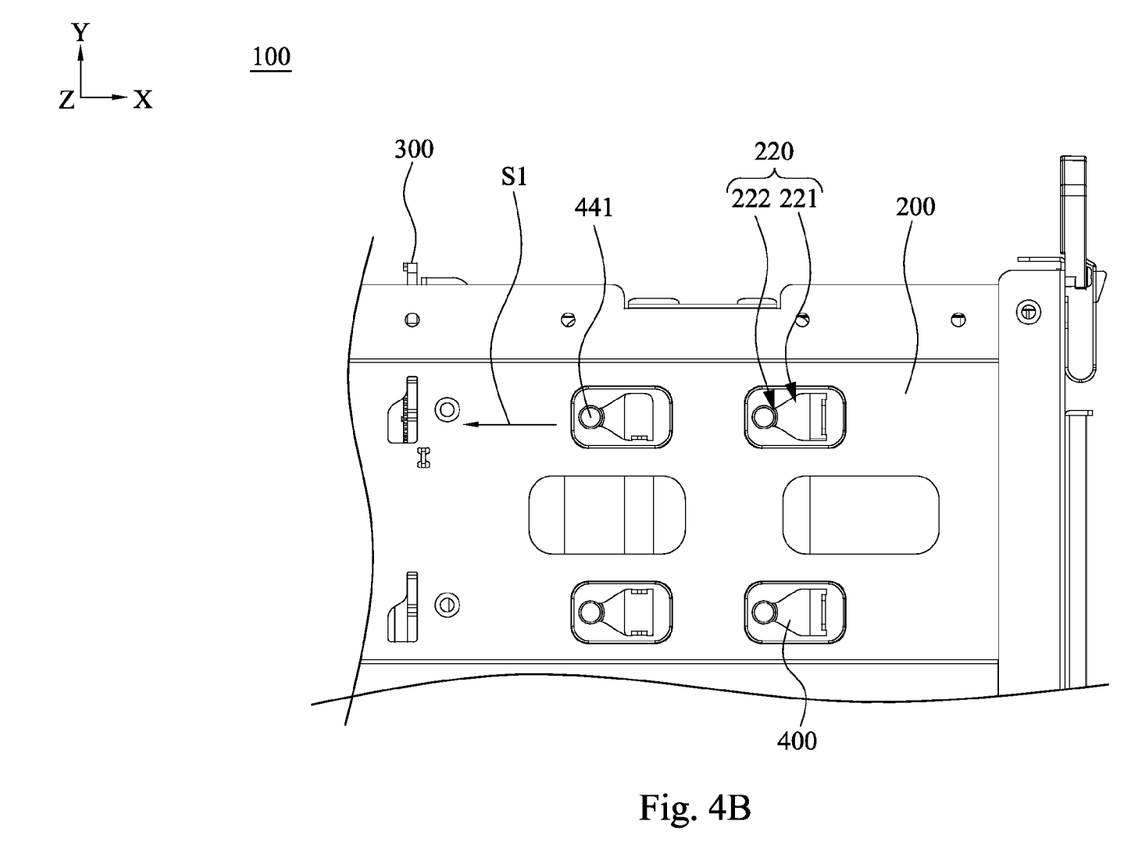

FIG. 4A to FIG. 4B are bottom views of intermediate stages of installing a hard disk unit 400 into a hard disk tray 200 of the sever device 100 according to the embodiment of the disclosure. As shown in FIG. 3A and FIG. 4A, when the user vertically places down the hard disk unit 400 on the placing surface 210 of the hard disk tray 200, the position-limiting hole 220 can be used as a fiducial mark to enable the head portion 441 of the position-limiting projection 440 to enter the corresponding position-limiting hole 220 exactly according to the position of the position-limiting hole 220, that is, the head portion 441 of the position-limiting projection 440 inserts into the larger area 221 of the position-limiting hole 220.

Next, as shown in FIG. 4B, when the user rotates the handle 500 towards the first end 401 of the hard disk unit 400, since the hard disk unit 400 is slid in along the direction S1 towards the storage array backplane 300 in relative to the placing surface 210, the position-limiting projection 440 also transversally moves along with the hard disk unit 400 from the larger area 221 of the position-limiting hole 220 into the smaller area 222 of the position-limiting hole 220. Thus, the head portion 441 of the position-limiting projection 440 is limited by the smaller area 222 of the position-limiting hole 220, and the hard disk unit 400 can be more effectively restrained by the hard disk tray 200.

It is noted that, as shown in FIG. 4A, because of the configuration of the position-limiting projection 440 and the position-limiting hole 220, the hard disk unit 400 fails to travel along the Z-axis; as shown in FIG. 3C, because of the configuration of the storage array backplane 300 and the first lateral plate 230, the hard disk unit 400 fails to travel along the X-axis; as shown in FIG. 1, because of the configuration of the lugs 280, the hard disk unit 400 fails to travel along the Y-axis. Accordingly, the hard disk unit 400 is three-dimensionally fixed on the hard disk tray 200.

Figure 5A:
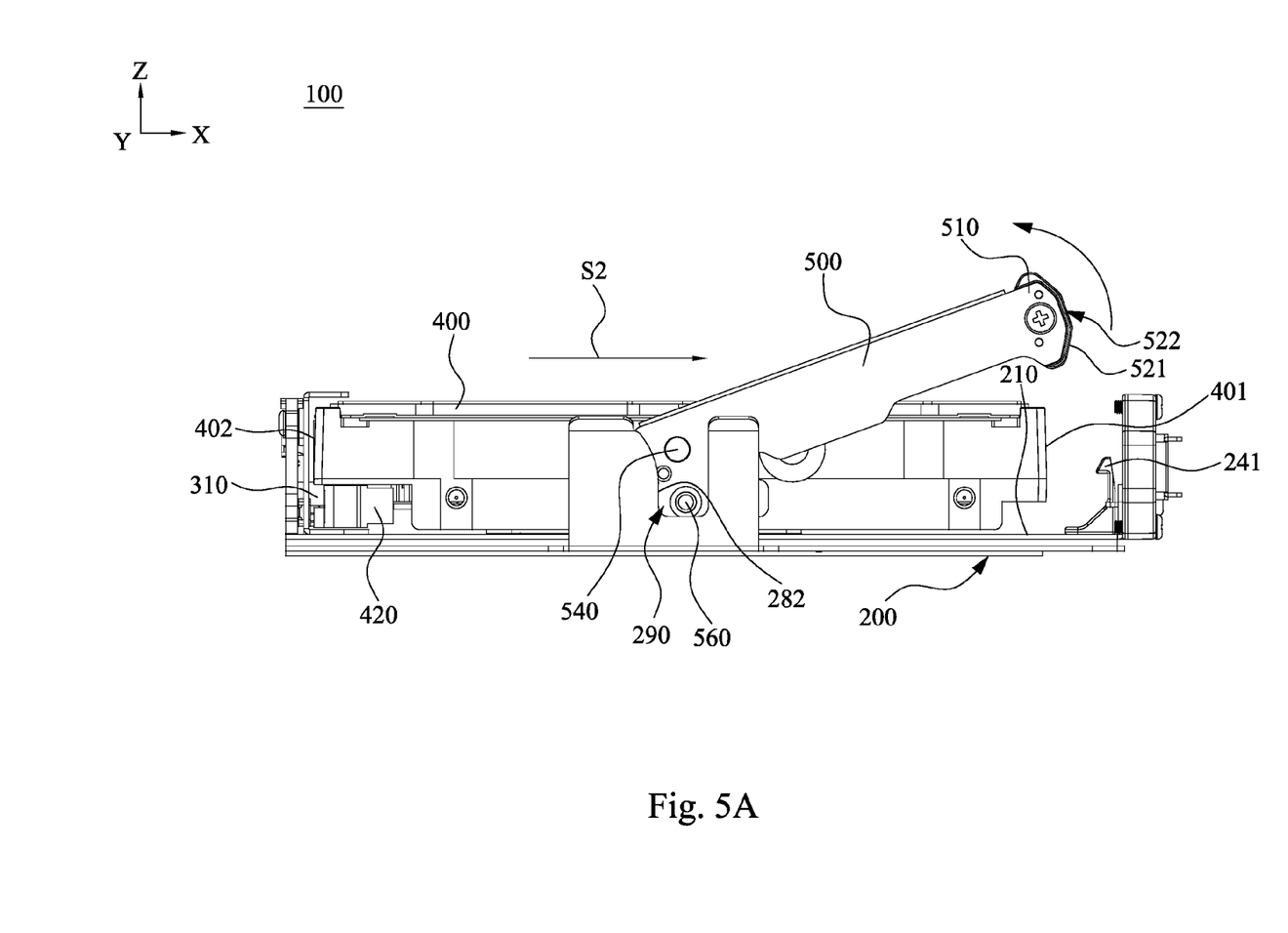
Figure 5B:
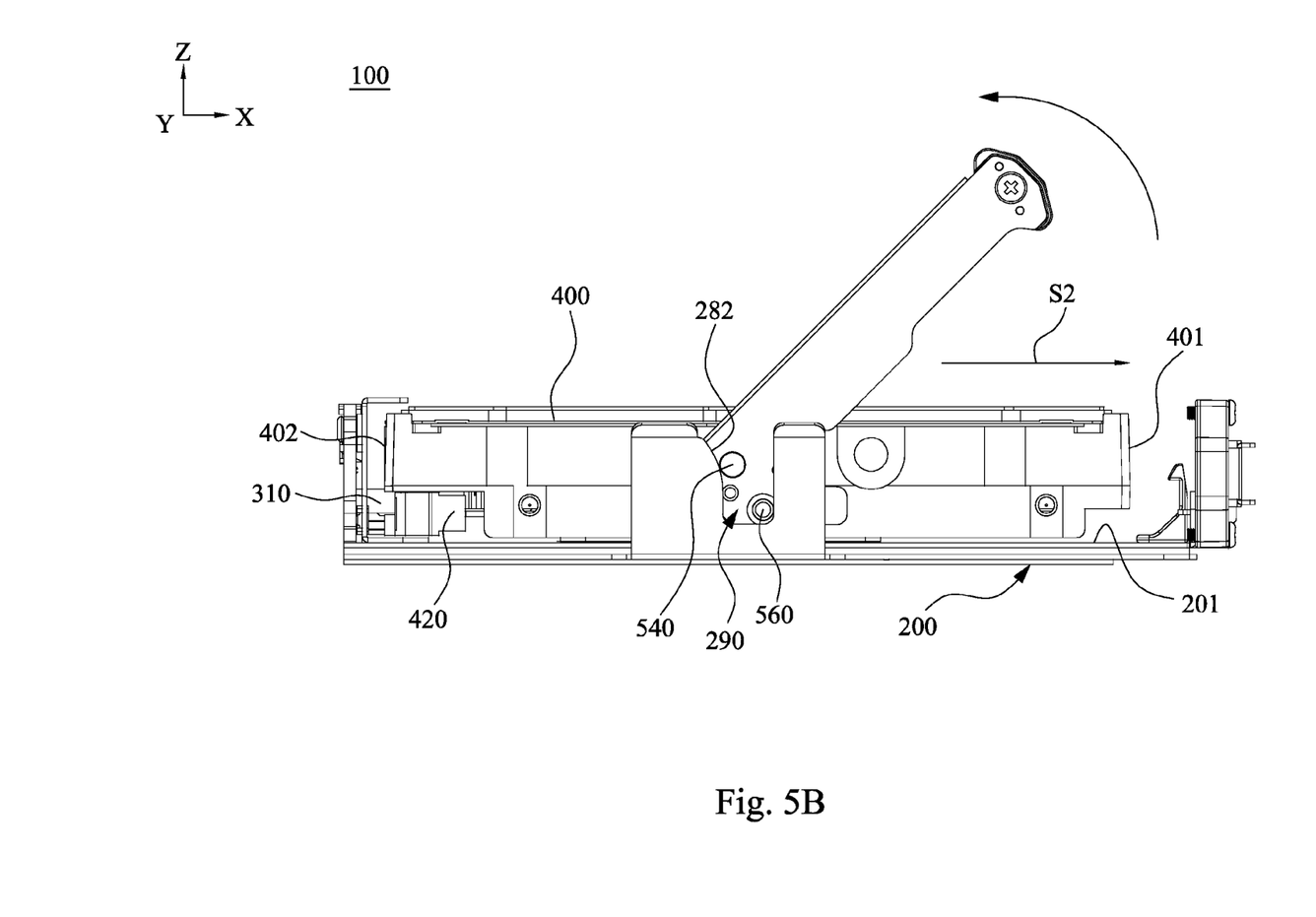
Figure 5C:
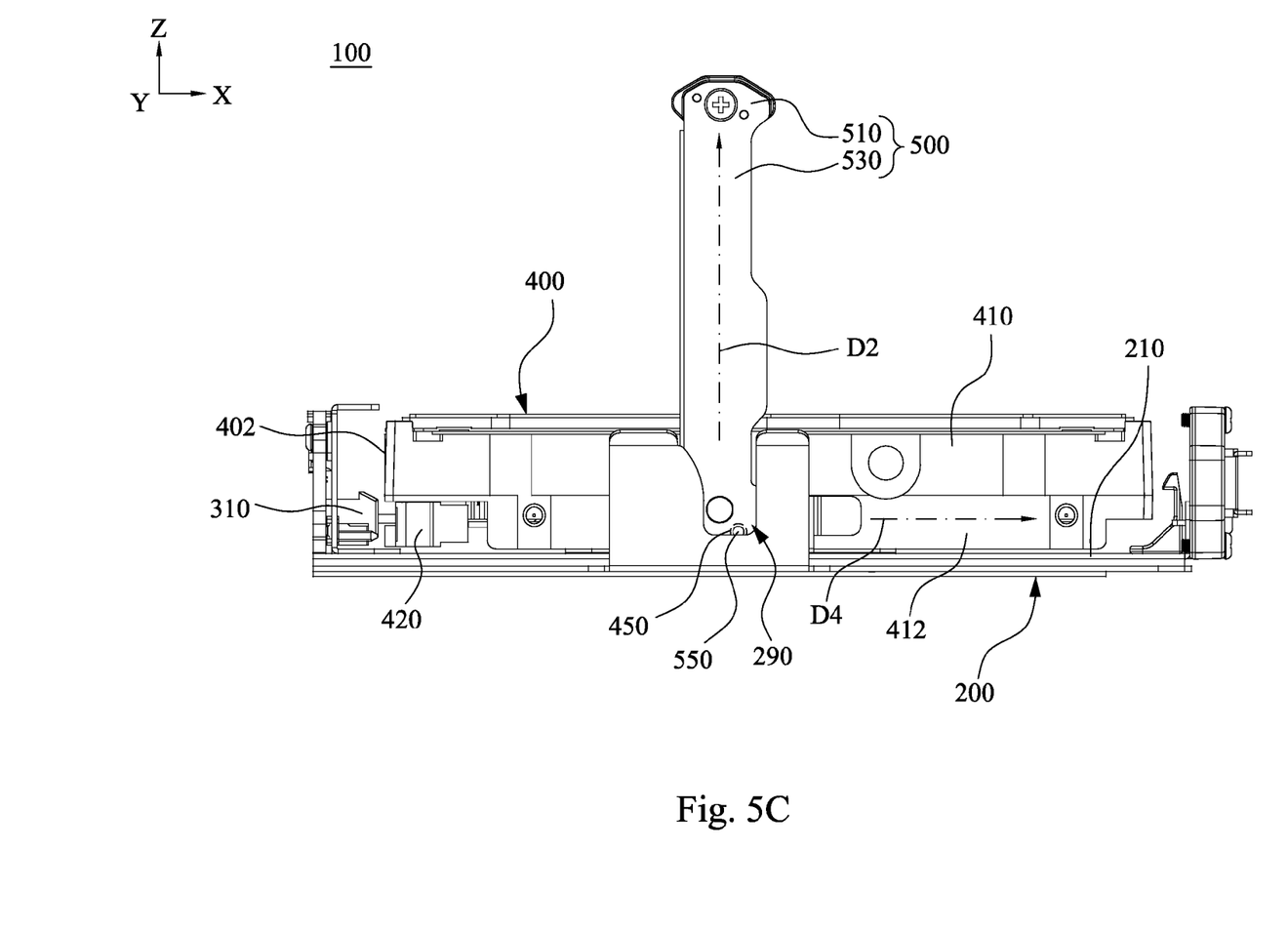

FIG. 5A to FIG. 5C are side views of intermediate stages of removing a hard disk unit 400 from a hard disk tray 200 of the sever device 100 according to the embodiment of the disclosure. In the embodiment below and related drawings, The procedure regarding how to remove a hard disk unit 400 from the hard disk tray 200 according to the present disclosure will be explained.

As shown in FIG. 5A, when a user desires to remove the hard disk unit 400 from the hard disk tray 200, the user first presses the movable member 521 to deform the elastic member 523 (FIG. 1). By the movement of the movable member 521, the recess 522 is escaped from the hook 241, and thus the movable member 521 is no longer restrained by the hook 241.

Next, as shown in FIG. 5A, the user may hold the handle 500 and rotate the handle 500 towards a direction away from the first end 401 (i.e. the second end 402) of the hard disk unit 400. During the rotation of the handle 500, along with the rotation of the handle 500, each of the protrusions 540 rotates around the corresponding pivot portion 560 to further contact the second inner edge 282 of the lug 280 in the slot 290. Then, as shown in FIG. 5B, when the protrusions 540 continuously rotates around the corresponding pivot portion 560, the protrusion 540 pushes the second inner edge 282 of the lug 280 into the slot 290. At this moment, the hard disk unit 400, on the contrary, is pushed by the lug 280 to slide in a direction S2 away from the storage array backplane 300 (i.e., the direction towards the first lateral plate 230) in relative to the placing surface 210, so as to allow the second connector 420 to be disconnected from the first connector 310. Therefore, as shown in FIG. 5C, the user can vertically lift up the hard disk unit 400 from the hard disk tray 200 by holding the handle 500 (referring to FIG. 4A) until the handle 500 is rotated to position the holder portion 510 to be right above the hard disk unit 400 by the user.

It is noted that, one having ordinary skill in the art of the disclosure may optionally design the profile of the second inner edge 282 of the lug 280 as a flat surface or an arc surface by considering the extent of the movement of the hard disk unit 400 towards the first lateral plate 230.

When the user lift sup and removes the hard disk unit 400 from the hard disk tray 200 by the handle 500, in order to prevent the hard disk unit 400 from shaking unexpectedly in relative to the handle 500, referring to FIG. 2B again, the handle 500 is provided with two bumps 550. Each of the bumps 550 is formed on one of the arms 530, and convexly extends to the hard disk unit 400. For example, the bump 550 is formed on a surface of the arm 530 facing the bracket 430. The hard disk tray 200 is provided with two concaves 450, and each of the concaves 450 is formed on the bracket 430. Each of the concave 450 can be a screw hole, and the size of the bump 550 and the size of the concave 450 can be the same or different.

Therefore, as shown in FIG. 5C, when the handle 500 is rotated to position the holder portion 510 right above the hard disk unit 400 by the user, the direction D2 to which the arms 530 extends and the longitudinal direction D4 of the lateral surface 412 of the main body 410 are orthogonal with each other. At this moment, the bump 550 is inserted into and limited in the concave 450 so as to fix the handle 500 and the hard disk unit 400 for decreasing the possibility of the hard disk unit 400 being damaged by impact.

However, the bracket is not an essential component in the disclosure. In other embodiments, the bracket also can be omitted, and alternatively, the main body is directly pivoted by the handle, and is directly fixed on the hard disk tray, and thus, the aforementioned components on the bracket is directly arranged on the main body.

To sum up, the server device provides a solution for rapidly removing or installing the hard disk units. By merely rotating the handle being pivotally connected to the hard disk unit, the hard disk units can be rapidly removed or installed on the hard disk tray without needing to use extra assembly tools thus enhancing the efficiency and convenience for assembling the hard disk unit Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A server device, comprising:
   a hard disk tray comprising a placing surface and a lug, the lug being disposed on the placing surface and formed with a slot in which two inner edges opposite to each other are defined;
   a hard disk unit removably disposed on the placing surface; and
   a handle pivotally connected to two opposite sides of the hard disk unit, the handle being substantially in a L-shape with a shorter section substantially perpendicular to a longer section, the shorter section of the handle having a protrusion arranged in the slot,
   wherein the protrusion is substantially circular;
   wherein, the handle has a first engaging portion, and the hard disk tray has a second engaging portion, and wherein when the handle is rotated towards the one end of the hard disk unit, due to the first engaging portion engaged with the second engaging portion, the hard disk unit is restrained by the hard disk tray,
   wherein the first engaging portion comprises a movable member and an elastic member, and the movable member comprises a recess,
   wherein the elastic member is disposed between the movable member and a holder portion of the handle,
   wherein two opposite ends of the elastic member respectively couple to the movable member and the holder portion of the handle, wherein the second engaging portion comprises a hook, the hook configured to be inserted into the recess for securing the movable member, wherein, when the movable member presses the elastic member, the recess escapes from the hook, wherein the hard disk tray further has a stopper, wherein, when the handle is rotated on the one end of the hard disk unit, the stopper stops the handle from rotating, and wherein the portions of the inner edges contacted by the protrusion are asymmetric.

2. The server device of claim 1, wherein the hard disk unit comprises a main body and a bracket, and the bracket is fixed on the main body and is pivotally connected by the handle.

3. The server device of claim 2, wherein the placing surface has a position-limiting hole and the bracket has a position-limiting projection, and wherein when the handle is rotated towards the one end of the hard disk unit, due to the position-limiting projection limited in the position-limiting hole, the hard disk unit is restrained by the hard disk tray.

4. The server device of claim 3, wherein the position-limiting hole has a larger area and a smaller area being communicative to the larger area hole, and wherein the position-limiting projection is merely limited in the smaller area of the position-limiting hole.

5. The server device of claim 2, further comprising:
a circuit board which is fixed on the hard disk tray and has a first connector; and the hard disk unit comprising a second connector disposed on the other end of two opposite ends of the hard disk unit, and wherein when the handle is rotated towards the one end of the hard disk unit, due to the second connector pluggably connected to the first connector, the hard disk unit is restrained by the hard disk tray.

6. The server device of claim 1, wherein the handle has a bump, and the hard disk tray has a concave, wherein when the handle is rotated towards in a direction away from the one end of the hard disk unit, the hard disk unit is released from the hard disk tray, and wherein the bump is inserted into and limited in the concave.

7. The server device of claim 1, wherein two opposite outer sides of the hard disk tray have respective slide rail disposed thereon.

8. The server device of claim 1, wherein the handle includes an arm and the protrusion is located along a centerline of the arm.

9. The server device of claim 1, wherein the inner edges comprise a rear edge and a front edge, and wherein the intermediate portion of the rear edge has a sloped upper portion.

* * * * *